(12) United States Patent
Park

(10) Patent No.: US 8,513,760 B2
(45) Date of Patent: Aug. 20, 2013

(54) IMAGE SENSOR

(75) Inventor: So Eun Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 13/589,858

(22) Filed: Aug. 20, 2012

(65) Prior Publication Data

US 2013/0154046 A1   Jun. 20, 2013

(30) Foreign Application Priority Data

Dec. 19, 2011   (KR) ................ 10-2011-0137536

(51) Int. Cl.
*H01L 27/146* (2006.01)
(52) U.S. Cl.
USPC ................................ 257/448; 257/E27.133
(58) Field of Classification Search
USPC ............................................ 257/444, 448
See application file for complete search history.

(56) References Cited

U.S. PATENT DOCUMENTS

| | | | |
|---|---|---|---|
| 6,930,299 B2* | 8/2005 | Ohkawa | 257/448 |
| 7,429,722 B2* | 9/2008 | Sekine et al. | 257/E27.133 |
| 7,663,194 B2* | 2/2010 | Lee | 257/401 |
| 8,115,155 B2 | 2/2012 | Lee | |

FOREIGN PATENT DOCUMENTS

| | | |
|---|---|---|
| JP | 2006-049692 | 2/2006 |
| KR | 10-2006-0000321 | 1/2006 |
| KR | 10-0828942 B1 | 5/2008 |

* cited by examiner

*Primary Examiner* — Chandra Chaudhari
(74) *Attorney, Agent, or Firm* — Sherr & Jiang, PLLC

(57) ABSTRACT

An image sensor includes a plurality of unit pixels. Each unit pixel has a photo diode for sensing external light to generate photo charges. A transfer transistor is connected to the photo diode for storing the photo charges generated in the photo diode into a floating diffusion region when being turned-on. An amplification transistor amplifies the photo charges stored into the floating diffusion region. A select transistor, connected to the amplification transistor, performs a switching operation. An output line, extended in a column direction, outputs the photo charges in accordance with the switching operation of the select transistor. The photo diode may be formed in such a manner to share the output line with its adjacent photo diode in a horizontal direction, so that the photo charges generated in the photo diode and its adjacent photo diode are outputted through the output line.

13 Claims, 4 Drawing Sheets

IMAGE SENSOR

The present application claims priority under 35 U.S.C. §119 to Korean Patent Application No. 10-2011-0137536 (filed on Dec. 19, 2011), which is hereby incorporated by reference in its entirety.

BACKGROUND

CMOS image sensors are devices that convert optical images into electrical signals. A CMOS image sensor may convert signal electrons generated in response to incident light into a voltage signal. Signal processing may be performed on the voltage signal, thereby reproducing image information. CMOS image sensors may include a plurality of MOS transistors, which may be manufactured using a CMOS formation process. The number of MOS transistors generally corresponds to the number of pixels. The MOS transistors may adopt a switching mode to sequentially detect pixel outputs.

Some CMOS image sensors have a relatively simple drive mode in comparison with a charge coupled device (CCD). CMOS image sensors may be implemented in a variety of scanning modes. A CMOS image sensor may be integrated in a single chip together with a signal processing circuit and may be substantially miniaturized. A CMOS image sensor may be manufactured by a compatible CMOS technique with manufacturing costs and power consumption minimized.

If the pitch of a pixel is smaller than 2.25 μm, a 2S-4T (two shared-four transistors) structure may be applied. The 2S-4T structure is developed in order to reduce the pitch of a pixel and enlarge the aperture ratio of a photo diode. In the 2S-4T structure, two pixels, each having four transistors, may be combined in a unit cell and three transistors may be commonly used by two photo diodes.

Figure 1:
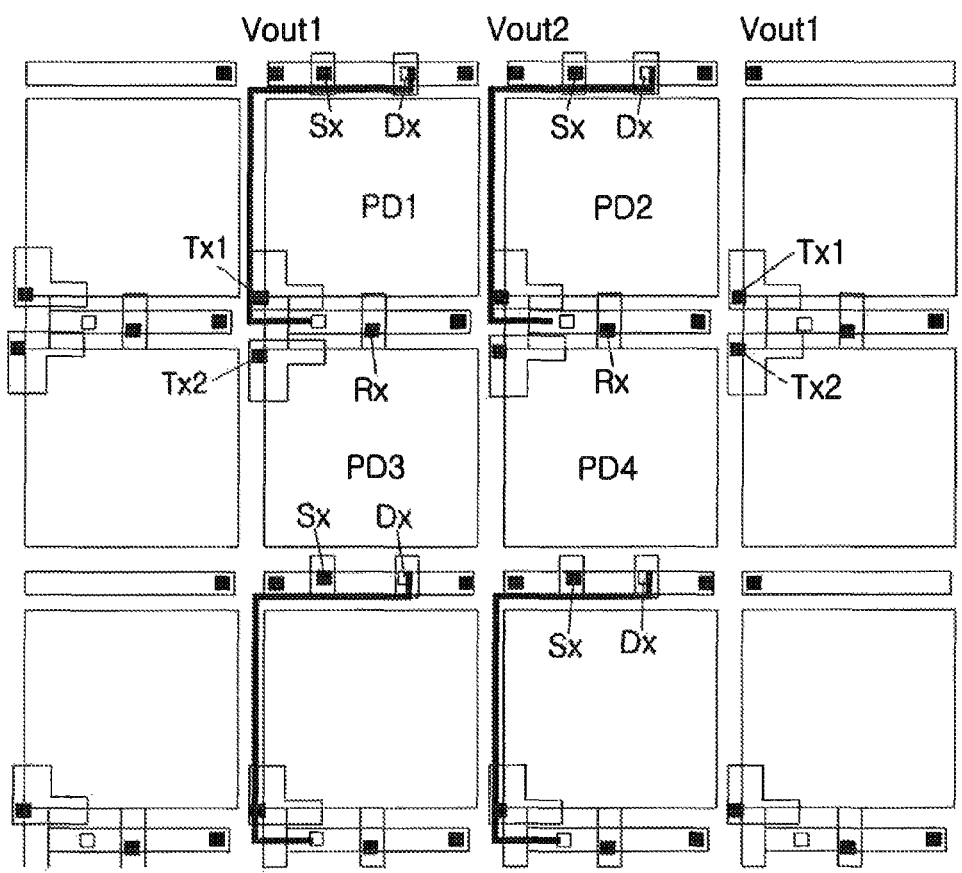
Figure 2:
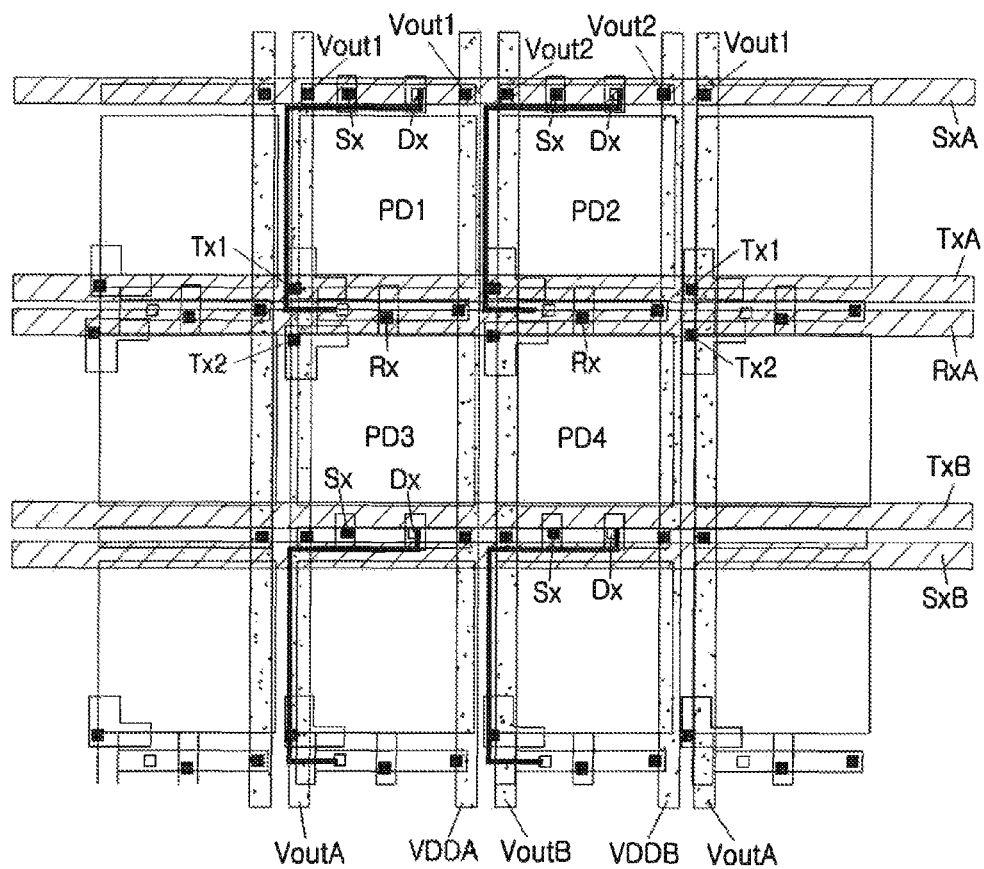

Example FIG. 1 is a plan view showing a layout of an image sensor with a 2S-4T structure in accordance with the related art. Example FIG. 2 is a plan view exemplarily illustrating an outputting operation of photo charges performed in the image sensor with the 2S-4T structure of FIG. 1.

As illustrated in FIG. 1, an image sensor with a 2S-4T structure may include a plurality of unit pixels, each having a photo diode PD (e.g. PD1 PD2, PD3, or PD4) for sensing light to generate a photo charge and four transistors (e.g. a transfer transistor Tx, a reset transistor Rx, an amplification transistor Dx, and a select transistor Sx connected to the photo diodes PD).

The transfer transistors Tx, which are respectively connected to the photo diodes PD1 to PD4, transfer the photo charges generated in the photo diodes PD1 to PD4 to their corresponding floating diffusion regions when they are respectively turned-on. For example, a transfer transistor Tx1 transfers a photo charge generated in a first photo diode PD1 to a floating diffusion region of the first photo diode PD1 when it is turned-on.

The amplification transistors Dx are connected to the transfer transistors Tx (e.g. Tx1 or Tx2) to amplify the photo charges stored in the floating diffusion regions, respectively. The reset transistors Rx are respectively connected to a supply voltage line VDDA or VDDB and the floating diffusion regions. The reset transistors Rx are controlled by a reset signal applied to their gates to reset the respective floating diffusion regions. The select transistors Sx are respectively connected to the amplification transistors Dx and are respectively configured to perform a turn-on operation. When the select transistors Sx are turned-on, the photo charges are outputted through output lines (VoutA or VoutB) extending in a column direction.

FIG. 2 exemplarily illustrates the output of the photo charges performed by the image sensor. The transfer transistors Tx1 of a first photo diode PD1 and a second photo diode PD2 are commonly connected to a first transfer signal line TxA. The transfer transistors Tx2 of a third photo diode PD3 and a fourth photo diode PD4 are commonly connected to a second transfer signal line TxB.

A first select signal may be applied through a first select signal line SxA to the select transistors Sx which is shared by the first photo diode PD1 and the second photo diode PD2. A second select signal may be applied through a second select signal line SxB to the select transistor Sx which is shared by the third photo diode PD3 and the fourth photo diode PD4.

In operation, when the first transfer signal line TxA and the first select signal line SxA are enabled, the photo charge of the first photo diode PD1 is outputted through the first output line VoutA. When the first transfer signal line TxA and the first select signal SxA are enabled, the photo charge of the second photo diode PD2 is outputted through the second output line VoutB. When the second transfer signal line TxB and the first select signal line SxA are enabled, the photo charge of the third photo diode PD3 is outputted through the first output line VoutA. When the second transfer signal line TxB and the first select signal line SxA are enabled, the photo charge of the fourth photo diode PD4 is outputted through the second output line VoutB.

FIG. 2 shows an image sensor in which four unit pixels have their respective photo diodes PD1 to PD4. It may be necessary to provide two output lines VoutA and VoutB and two supply voltage lines VDDA and VDDB. Likewise, if the image sensor includes eight photo diodes, then four output lines may be required.

However, these metal lines including the output lines, the supply voltage lines and other metal lines may affect the photo charge outputs from the photo diodes (e.g. sensitivity of the pixels). For example, the metal lines may shield edges of the photo diodes, which may result in a reduction of the aperture ratio of the photo diodes. As another example, not only the metal lines in columns (e.g. output lines VoutA and VoutB and supply voltage lines VDDA and VDDB) may partially shield the surface of the photo diodes, but the metal lines in rows (e.g. select signal lines SxA and SxB and transfer signal lines TxA and TxB) may also partially shield the surface of the photo diodes. Due to these aspects and others, the sensitivity of all pixels may deteriorate.

SUMMARY

Embodiments relate to an image sensor (e.g. a CMOS (Complementary Metal Oxide Semiconductor) image sensor) with enhanced sensitivity of pixels by securing a sufficient aperture ratio of a photo diode. Embodiments relate to an image sensor with a sufficient aperture ratio by using metal lines affecting the aperture ratio of photo diodes to enhance the sensitivity of small-sized pixels with a pitch of no more than 1.75 μm.

Embodiments relate to an image sensor including at least one of: (a) a plurality of unit pixels, wherein each unit pixel includes a photo diode for sensing external light to generate photo charges; (b) a transfer transistor, connected to the photo diode, configured to store the photo charges generated in the photo diode into a floating diffusion region when being turned-on; (c) an amplification transistor configured to amplify the photo charges stored into the floating diffusion region; (d) a select transistor, connected to the amplification transistor, configured to perform a switching operation; and (e) an output line, extended in a column direction, configured to output the photo charges in accordance with the switching operation of the select transistor. In embodiments, the photo diode is formed to share the output line with its adjacent photo diode in a horizontal direction, so that the photo charges generated in the photo diode and its adjacent photo diode are outputted through the output line.

In embodiments, an image sensor includes a supply voltage line, wherein the supply voltage line is shared between a pair of the photo diode and its adjacent photo diodes in a horizontal direction share and another pair of a photo diode and its adjacent photo diode in a horizontal direction.

In embodiments, an image sensor includes at least one of: (a) a plurality of eight photo diodes for generating photo charges, each having a transfer transistor, and each pair of two photo diodes having a select transistor shared by the pair; (b) a first select signal line for applying a first select signal to a first select transistor which is commonly used by a pair of fourth and its adjacent eight photo diodes in a vertical direction; (c) a first output line for outputting photo charges of a pair of second and its adjacent sixth photo diodes in a vertical direction when the first select signal is applied through the first select signal line; (d) a second select signal line for applying a second select signal to a second select transistor which is commonly used by a pair of first and its adjacent fifth photo diodes in a vertical direction, wherein photo charges of the first and its adjacent fifth photo diodes are outputted through the first output line; (e) a second output line for outputting photo charges of a pair of third and its adjacent seventh photo diodes in a vertical direction and a pair of fourth and its adjacent eighth photo diodes in a vertical direction, where the pair of the third and the seventh photo diodes commonly use a third select transistor to which the second select signal is provided from the second select signal line, and the pair of the fourth and the eighth photo diodes commonly use a fourth select transistor to which the first select signal is provided from the first select signal line; (f) a first transfer signal line connected to the transfer transistors of the first, the second, the third and the fourth photo diodes arranged in a horizontal direction; and (g) a second transfer signal line connected to the transfer transistors of the fifth, the sixth, the seventh and the eighth photo diodes arranged in a horizontal direction.

In embodiments, the first photo diode outputs the photo charge through the first output line when a first transfer signal to turn-on the first transfer transistor is applied through the first transfer signal line and the second select signal to turn-on the select transistor is applied through the second select signal line.

In embodiments, the second photo diode outputs the photo charge through the first output line when the first transfer signal to turn-on the first transfer transistor is applied through the first transfer signal line and the first select signal to turn-on the select transistor is applied through the first select signal line. In embodiments, the third photo diode outputs the photo charge through the second output line when the first transfer signal to turn-on the first transfer transistor is applied through the first transfer signal line and the second select signal to turn-on the select transistor is applied through the second select signal line.

In embodiments, the fourth photo diode outputs the photo charge through the second output line when the first transfer signal to turn-on the first transfer transistor is applied through the first transfer signal line and the first select signal to turn-on the select transistor is applied through the first select signal line. In embodiments, the fifth photo diode outputs the photo charge through the first output line when the second transfer signal to turn-on the second transfer transistor is applied through the second transfer signal line and the second select signal to turn-on the select transistor is applied through the second select signal line.

In embodiments, the sixth photo diode outputs the photo charge through the first output line when the second transfer signal to turn-on the second transfer transistor is applied through the second transfer signal line and the first select signal to turn-on the select transistor is applied through the first select signal line. In embodiments, the seventh photo diode outputs the photo charge through the second output line when the second transfer signal to turn-on the second transfer transistor is applied through the second transfer signal line and the second select signal to turn-on the select transistor is applied through the second select signal line. In embodiments, the eighth photo diode outputs the photo charge through the second output line when the second transfer signal to turn-on the second transfer transistor is applied through the second transfer signal line and the first select signal to turn-on the select transistor is applied through the first select signal line.

In embodiments, the first and its adjacent second photo diodes in a horizontal direction are arranged adjacent in a horizontal direction to the fifth and its adjacent sixth photo diodes in a horizontal direction about the first output line. In embodiments, the third and its adjacent fourth photo diodes in a horizontal direction are arranged adjacent in a vertical direction to the seventh and its adjacent eighth photo diodes in a horizontal direction about the second output line.

DRAWINGS

The above and other objects and features of embodiments will become apparent from the following description of embodiments given in conjunction with the accompanying drawings, in which:

Example FIG. 1 is a plan view showing a layout of an image sensor with a 2S-4T in accordance with the related art.

Example FIG. 2 is a plan view exemplarily illustrating an output operation of photo charges performed in the image sensor of the 2S-4T structure of FIG. 1, in accordance with the related art.

Figure 3:
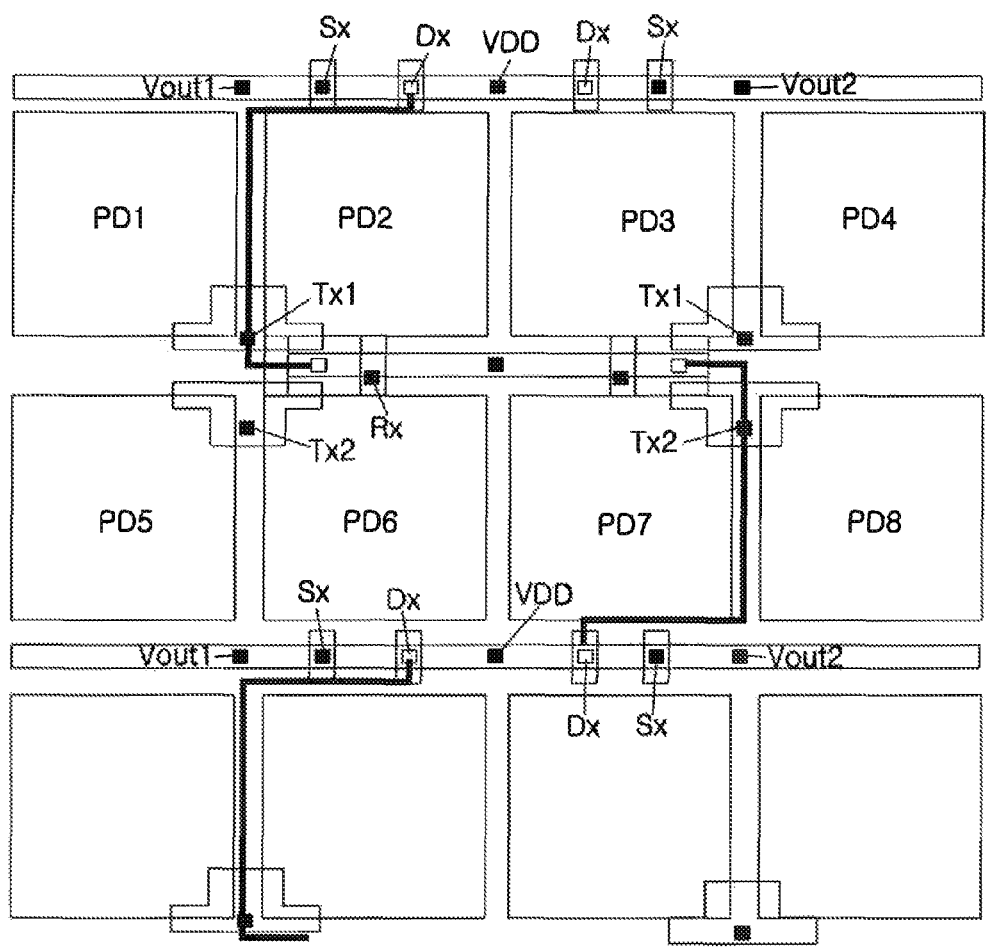

Example FIG. 3 is a plan view showing a layout of an image sensor with a 2S-4T structure, in accordance with embodiments.

Figure 4:
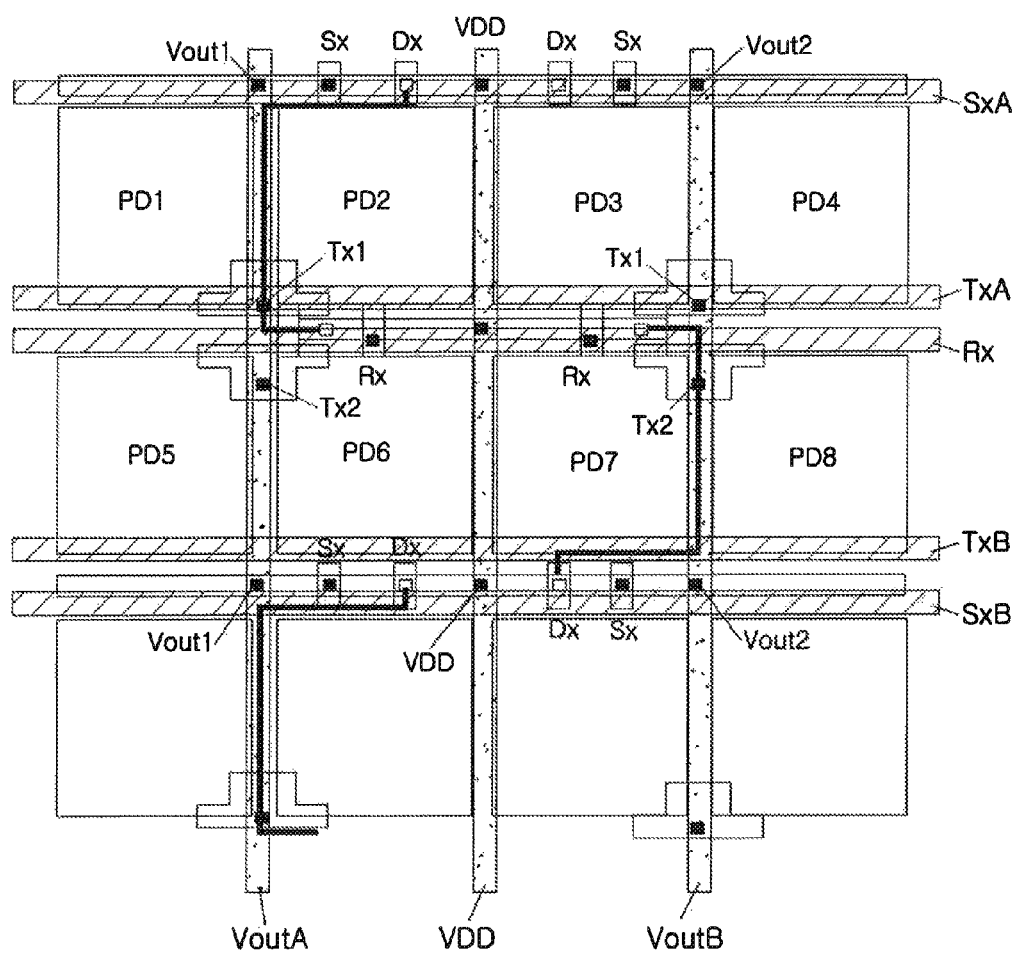

Example FIG. 4 is a plan view exemplarily illustrating an output operation of photo charges performed in the image sensor of the 2S-4T structure, in accordance with embodiments.

DESCRIPTION

The advantages and features of embodiments and methods of accomplishing these will be clearly understood from the following embodiments taken in conjunction with the accompanying drawings. However, embodiments are not limited and may be implemented in various forms. It should be noted that the present embodiments are provided to make a full disclosure and also to allow those skilled in the art to understand the full range of the embodiments. Therefore, embodiments are to be defined only by the scope of the appended claims.

Example FIG. 3 is a plan view showing a layout of an image sensor with a 2S-4T structure, in accordance with embodiments. Example FIG. 4 is a plan view exemplarily illustrating an output operation of photo charges performed in the image sensor of the 2S-4T structure, in accordance with embodiments.

For convenience of explanation and an easy understanding of the technical subject matter of the embodiments, it is assumed that an example image sensor includes eight unit pixels, each having a photo diode. However, it should be understood by the ordinary skilled person in the art that the number of photo diodes may be varied in different configurations without departing from the scope of the embodiments.

As illustrated in FIGS. 3 and 4, an image sensor in accordance with embodiments may include a plurality of unit pixels, each having its respective a photo diodes PD1, PD2, PD3, PD4, PD5, PD6, PD7, or PD8, for sensing external light to generate a photo charge. The image sensor may further include transfer transistors Tx, reset transistors Rx, amplification transistors Dx, and select transistors Sx connected to the their respective photo diodes PD1 to PD8.

In embodiments, the transfer transistors Tx may be connected to their respective photo diodes PD1 to PD8 and used to transfer the photo charges generated in the photo diodes PD1 to PD8 to floating diffusion regions. For example, a transfer transistor Tx1 may transfer a photo charge generated in a first photo diode to a floating diffusion region when it is turned-on.

In embodiments, the amplification transistors Dx may be connected to their respective transfer transistors Tx1 or Tx2 and may be used to amplify the photo charges stored in the floating diffusion regions. The reset transistors Rx may be connected to a supply voltage line VDD and the floating diffusion regions, and may be configured to be reset under the control of a reset signal. The select transistors Sx may be connected to their respective amplification transistors Dx and are configured to perform a turn-on operation, respectively. In embodiments, when the select transistors Sx are turned-on, the photo charges are outputted through their respective output lines VoutA or VoutA extending in a column direction, as shown in FIG. 4. In embodiments, a pair of horizontally adjacent photo diodes in a first row are arranged in such a manner as to commonly share the first output line VoutA extending in a column direction. For example, a first photo diode PD1 and adjacent second photo diode PD2 in a horizontal direction are arranged to commonly share the first output line VoutA extending in the column direction. The photo charges generated in the first photo diode PD1 and the second photo diode PD2 may be configured to be outputted through the first output line VoutA. Similarly, an adjacent pair of fifth photo diode PD5 and a sixth photo diode PD6 in a horizontal direction may be arranged in a second row to commonly share the first output line VoutA which extends in the column direction. Therefore, the photo charges generated in the fifth photo diode PD5 and the sixth photo diode PD6 may be configured to be output through the first output line VoutA.

In embodiments, another pair of horizontally adjacent photo diodes in the first row are arranged in such a manner as to commonly share the second output line VoutB extending in a column direction. For example, the third photo diode PD3 and the fourth photo diode PD4 adjacent in a horizontal direction in the first row are arranged in such a manner as to commonly share the second output line VoutB extending in the column direction. The photo charges generated in the third photo diode PD3 and the fourth photo diode PD4 may be configured to be output through the second output line VoutB extending in the column direction.

Similarly, in accordance with embodiments, horizontally adjacent seventh photo diode PD7 and an eighth photo diode PD8 in the second row are arranged in such a manner as to commonly share the second output line VoutB which extends in the column direction. Photo charges generated in the seventh photo diode PD7 and the eighth photo diode PD8 may be configured to be output through the second output line VoutB, in accordance with embodiments.

In embodiments, pairs of adjacent photo diodes (e.g. PD1, PD2, PD3, and PD4) in the first row are configured to commonly share a supply voltage line VDD extending in a column direction with pairs of adjacent photo diodes (e.g. PD5, PD6, PD7, and PD8) in the second column.

In embodiments, an image sensor may be configured to commonly share one output line VoutA or VoutB extending in the column direction between adjacent photo diodes in the horizontal direction. In embodiments, an image sensor may be configured to commonly share one supply voltage line VDD extending in the column direction between adjacent pairs of photo diodes in the horizontal direction. Therefore, in accordance with embodiments, the number of the metal lines may be minimized to widen the open area of the photo diodes in comparison with the related art. Accordingly, the aperture ratio of the photo diodes can be sufficiently secured, to thereby enhance the sensitivity of the pixels in the image sensor, in accordance with embodiments.

FIG. 4 is a plan view exemplarily illustrating an output operation of photo charges performed in the image sensor of the 2S-4T, in accordance with embodiments. As shown in FIG. 4, in an image sensor in accordance with embodiments, the first select signal line SxA is used to apply a first select signal to the select transistor Sx which are commonly shared by the second photo diode PD2 and the sixth photo diode PD6. The photo charges generated in the second photo diode PD2 and the sixth photo diode PD6 may be output through the first output line VoutA in accordance with the first select signal applied through the first select signal line SxA, in accordance with embodiments.

In embodiments, the second select signal line SxB may be used to apply a second select signal to the select transistor Sx which is commonly shared by the first photo diode PD1 and the fifth photo diode PD5 whose photo charges are output through the first output line VoutA. The second output line VoutB may be used to output the photo charges generated in the third and seventh photo diodes PD3 and PD7 (which commonly share the select transistor Sx to which the second select signal is applied) through the second select signal line SxB, in accordance with embodiments. The second output line Vout2 may be used to output the photo charges generated in the fourth and the eighth photo diodes PD4 and PD8 (which commonly share the select transistor Sx to which the second select signal is applied) through the first select signal line SxA, in accordance with embodiments.

In embodiments, the first transfer signal line TxA may be connected to the transfer transistors Tx1 of the first to the fourth photo diodes (e.g. PD1, PD2, PD3, and PD4). The second transfer signal line Tx2 may be connected to the transfer transistor Tx2 of the fifth to the eighth photo diodes PD5, PD6, PD7 and PD8, in accordance with embodiments.

Embodiments relate to the output operation of photo charges from the photo diodes. In embodiments, the first photo diode PD1 may output a photo charge through the first output line VoutA when a first transfer signal to turn-on the first transfer transistor Tx1 is applied through the first transfer signal line TxA and a second select signal to turn-on the select transistor Sx is applied through the second select signal line SxB. The second photo diode PD2 may output the photo charge through the first output line VoutA when the first transfer signal to turn-on the first transfer transistor Tx1 is applied through the first transfer signal line TxA and the first select signal to turn-on the select transistor Sx is applied through the second select signal line SxB, in accordance with embodiments.

The third photo diode PD3 may output the photo charge through the second output line VoutB when the first transfer signal to turn-on the first transfer transistor Tx1 is applied through the first transfer signal line TxA and the second select signal to turn-on the select transistor Sx is applied through the second select signal line SxB, in accordance with embodiments. The fourth photo diode PD4 may output the photo charge through the second output line VoutB when the first transfer signal to turn-on the first transfer transistor Tx1 is applied through the first transfer signal line TxA and the first select signal to turn-on the select transistor Sx is applied through the first select signal line SxA, in accordance with embodiments.

The fifth photo diode PD5 may output the photo charge through the first output line VoutA when the second transfer signal to turn-on the second transfer transistor Tx2 is applied through the second transfer signal line TxB and the second select signal turn-on the select transistor Sx is applied through the second select signal line SxB, in accordance with embodiments. The sixth photo diode PD6 may output the photo charge through the first output line VoutA when the second transfer signal to turn-on the second transfer transistor Tx2 is applied through the second transfer signal line TxB and the first select signal to turn-on the select transistor Sx is applied through the first select signal line SxA, in accordance with embodiments.

The seventh photo diode PD7 may output the photo charge through the second output line VoutB when the second transfer signal to turn-on the second transfer transistor Tx2 is applied through the second transfer signal line TxB and the second select signal to turn-on the select transistor Sx is applied through the second select signal line SxB, in accordance with embodiments. The eighth photo diode PD5 may output the photo charge through the second output line VoutB when the second transfer signal to turn-on the second transfer transistor Tx2 is applied through the second transfer signal line TxB and the first select signal to turn-on the select transistor Sx is applied through the first select signal line SxA, in accordance with embodiments.

As illustrated in FIG. 4, in accordance with embodiments, a set of the first and the fifth photo diodes PD1 and PD5 disposed in the first and the second rows are arranged horizontally adjacently to another set of the second and the sixth photo diodes PD2 and PD6 disposed in the first and the second rows, with the first output line VoutA therebetween. In accordance with embodiments, a set of the fourth and the eighth photo diodes PD4 and PD5 in the first and the second rows are arranged horizontally adjacently to another set of the third and seventh photo diodes PD3 and PD7 disposed in the first and the second rows, with the second output line Vout2 therebetween.

As described above, the image sensor in accordance with embodiments commonly shares such metal lines as a supply voltage line and an output line, substantially positively affecting the aperture ratio of a photo diode, to sufficiently secure the aperture ratio of a photo diode. Accordingly, the sensitivity of an image sensor including small pixels having a pitch of no more than 1.75 μm may be enhanced.

While embodiments have been shown and described, it will be understood by those skilled in the art that various changes and modification may be made without departing the scope of the embodiments as defined the following claims.

What is claimed is:
1. An image sensor comprising:
a plurality of unit pixels, wherein each unit pixel comprises a photo diode for sensing external light to generate photo charges;
a transfer transistor connected to the photo diode, wherein the transfer transistor is configured to store the photo charges generated in the photo diode into a floating diffusion region when being turned-on;
an amplification transistor, wherein the amplification transistor is configured to amplify the photo charges stored into the floating diffusion region;
a select transistor connected to the amplification transistor, wherein the select transistor is configured to perform a switching operation; and
an output line extending in a column direction, wherein the output line is configured to output the photo charges in accordance with the switching operation of the select transistor,
wherein the photo diode is arranged to share the output line with an adjacent photo diode in a horizontal a direction, so that the photo charges generated in the photo diode and the adjacent photo diode are outputted through the output line.

2. The image sensor of claim 1 comprising a supply voltage line, wherein the supply voltage line is shared between the photo diode and the adjacent photo diodes as a first pair of photo diodes in a horizontal direction and a second pair of photo diodes in a horizontal direction.

3. An image sensor comprising:
a plurality of eight photo diodes configured to generate photo charges, wherein each of said plurality of eight photo diodes has a transfer transistor, wherein said plurality of eight photo diodes comprises a plurality of photo diode pairs, wherein each of said photo diode pairs has a select transistor shared by each of said photo diode pairs;
a first select signal line configured to apply a first select signal to a first select transistor which is commonly used by a first photo diode pair of said photo diode pairs, wherein said first photo diode pair comprises vertically adjacent fourth photo diode and eighth photo diode;
a first output line configured to output photo charges of a second photo diode pair of said photo diode pairs when the first select signal is applied through the first select signal line, wherein said second photo diode pair comprises vertically adjacent first photo diode and sixth photo diode;
a second select signal line configured to apply a second select signal to a second select transistor which is commonly used by a third photo diode pair of said photo diode pairs, wherein said third photo diode pair comprises vertically adjacent first photo diode and fifth photo diode, wherein photo charges of the first photo diode and fifth photo diode are output through the first output line;
a second output line configured to output photo charges of a fourth photo diode pair of said photo diode pairs and said first photo diode pair, wherein said fourth photo diode pair comprises vertically adjacent third photo diode and seventh photo diode, wherein the fourth photo diode pair is configured to commonly use a third select transistor to which the second select signal is provided from the second select signal line, and wherein the first photo diode pair is configured to commonly use a fourth select transistor to which the first select signal is provided from the first select signal line;

a first transfer signal line connected to the transfer transistors of the first photo diode, the second photo diode, the third photo diode, and the fourth photo diode are arranged in a horizontal direction; and a second transfer signal line connected to the transfer transistors of the fifth photo diode, the sixth photo diode, the seventh photo diode, and the eighth photo diode arranged in a horizontal direction.

4. The image sensor of claim 3, wherein the first photo diode is configured to output the photo charge through the first output line when a first transfer signal to turn-on the first transfer transistor is applied through the first transfer signal line and the second select signal to turn-on the select transistor is applied through the second select signal line.

5. The image sensor of claim 3, wherein the second photo diode outputs the photo charge through the first output line when the first transfer signal to turn-on the first transfer transistor is applied through the first transfer signal line and the first select signal to turn-on the select transistor is applied through the first select signal line.

6. The image sensor of claim 3, wherein the third photo diode outputs the photo charge through the second output line when the first transfer signal to turn-on the first transfer transistor is applied through the first transfer signal line and the second select signal to turn-on the select transistor is applied through the second select signal line.

7. The image sensor of claim 3, wherein the fourth photo diode outputs the photo charge through the second output line when the first transfer signal to turn-on the first transfer transistor is applied through the first transfer signal line and the first select signal to turn-on the select transistor is applied through the first select signal line.

8. The image sensor of claim 3, wherein the fifth photo diode outputs the photo charge through the first output line when the second transfer signal to turn-on the second transfer transistor is applied through the second transfer signal line and the second select signal to turn-on the select transistor is applied through the second select signal line.

9. The image sensor of claim 3, wherein the sixth photo diode outputs the photo charge through the first output line when the second transfer signal to turn-on the second transfer transistor is applied through the second transfer signal line and the first select signal to turn-on the select transistor is applied through the first select signal line.

10. The image sensor of claim 3, wherein the seventh photo diode outputs the photo charge through the second output line when the second transfer signal to turn-on the second transfer transistor is applied through the second transfer signal line and the second select signal to turn-on the select transistor is applied through the second select signal line.

11. The image sensor of claim 3, wherein the eighth photo diode outputs the photo charge through the second output line when the second transfer signal to turn-on the second transfer transistor is applied through the second transfer signal line and the first select signal to turn-on the select transistor is applied through the first select signal line.

12. The image sensor of claim 3, wherein the first photo diode and the horizontally adjacent second photo diode are arranged adjacent to the fifth photo diode and the horizontally adjacent sixth photo diode in a horizontal direction about the first output line.

13. The image sensor of claim 3, wherein the third photo diode and its horizontally adjacent fourth photo diode are arranged adjacent in a vertical direction to the seventh photo diode and its horizontally adjacent eighth photo diode about the second output line.

* * * * *